(12) United States Patent
Liu et al.

(10) Patent No.: US 10,431,682 B2
(45) Date of Patent: Oct. 1, 2019

(54) VERTICAL VACUUM CHANNEL TRANSISTOR

(71) Applicants: INTERNATIONAL BUSINESS MACHINES CORPORATION, Armonk, NY (US); GLOBALFOUNDRIES, INC., Grand Cayman (KY); STMicroelectronics, Inc., Coppell, TX (US)

(72) Inventors: Qing Liu, Irvine, CA (US); Ruilong Xie, Schenectady, NY (US); Chun-chen Yeh, Clifton Park, NY (US)

(73) Assignees: INTERNATIONAL BUSINESS MACHINES CORPORATION, Armonk, NY (US); STMICROELECTRONICS, INC., Coppell, TX (US); GLOBALFOUNDRIES, INC. (KY)

( * ) Notice: Subject to any disclaimer, the term of this patent is extended or adjusted under 35 U.S.C. 154(b) by 0 days.

(21) Appl. No.: 15/693,952

(22) Filed: Sep. 1, 2017

(65) Prior Publication Data

US 2018/0102433 A1    Apr. 12, 2018

Related U.S. Application Data

(62) Division of application No. 15/287,134, filed on Oct. 6, 2016, now Pat. No. 9,793,395.

(51) Int. Cl.
*H01L 29/78* (2006.01)
*H01L 29/66* (2006.01)
(Continued)

(52) U.S. Cl.
CPC .... *H01L 29/7827* (2013.01); *H01L 21/02614* (2013.01); *H01L 21/30604* (2013.01);
(Continued)

(58) Field of Classification Search
CPC ............. H01L 29/66666; H01L 29/7827
See application file for complete search history.

(56) References Cited

U.S. PATENT DOCUMENTS 5,012,153 A    4/1991  Atkinson et al.
5,077,597 A    12/1991 Mishra
(Continued)

FOREIGN PATENT DOCUMENTS

| CN | 105529356 A | 4/2016 |
|---|---|---|
| JP | 4137434 B2 | 8/2008 |
| JP | 4366525 B2 | 11/2009 |

OTHER PUBLICATIONS

List of IBM Patents or Patent Applications Treated as Related; (Appendix P), Filed Sep. 1, 2017; 2 pages.
(Continued)

*Primary Examiner* — Stephen M Bradley
(74) *Attorney, Agent, or Firm* — Cantor Colburn LLP; Vazken Alexanian

(57) ABSTRACT

A method of fabricating features of a vertical transistor include performing a first etch process to form a first portion of a fin in a substrate; depositing a spacer material on sidewalls of the first portion of the fin; performing a second etch process using the spacer material as a pattern to elongate the fin and form a second portion of the fin in the substrate, the second portion having a width that is greater than the first portion; oxidizing a region of the second portion of the fin beneath the spacer material to form an oxidized channel region; and removing the oxidized channel region to form a vacuum channel.

5 Claims, 24 Drawing Sheets

(51) Int. Cl.
 *H01L 21/306* (2006.01)
 *H01L 21/02* (2006.01)
 *H01L 21/324* (2006.01)
 *H01L 29/417* (2006.01)

(52) U.S. Cl.
 CPC ...... *H01L 21/324* (2013.01); *H01L 29/41741* (2013.01); *H01L 29/66553* (2013.01); *H01L 29/66666* (2013.01)

(56) References Cited

U.S. PATENT DOCUMENTS

| | | | |
|---|---|---|---|
| 5,389,796 A | | 2/1995 | Kang et al. |
| 5,977,693 A | | 11/1999 | Nakamoto et al. |
| 6,642,575 B1 | * | 11/2003 | Ono ................ H01L 21/823828 257/302 |
| 7,646,149 B2 | | 1/2010 | Naaman et al. |
| 8,378,415 B2 | | 2/2013 | Higashino |
| 9,029,211 B2 | | 5/2015 | Mao |
| 9,117,875 B2 | * | 8/2015 | Jacob ................ H01L 21/76224 |
| 9,147,755 B1 | | 9/2015 | Han et al. |
| 9,331,189 B2 | * | 5/2016 | Kim .................... H01L 29/7613 |
| 9,853,163 B2 | * | 12/2017 | Zhang ............... H01L 29/78642 |
| 2007/0045721 A1 | * | 3/2007 | Forbes ................ H01L 29/7391 257/328 |
| 2011/0042740 A1 | * | 2/2011 | Masuoka .......... H01L 21/76804 257/329 |
| 2013/0153990 A1 | * | 6/2013 | Lee .................... H01L 29/66666 257/329 |
| 2016/0349208 A1 | * | 12/2016 | Cao .................... G01N 27/4146 |

OTHER PUBLICATIONS

Qing Liu et al., "Vertical Vacuum Channel Transistor", U.S. Appl. No. 15/287,134, filed Oct. 6, 2016.

Qing Liu et al., "Vertical Vacuum Channel Transistor", U.S. Appl. No. 15/693,938, filed Sep. 1, 2017.

* cited by examiner

VERTICAL VACUUM CHANNEL TRANSISTOR

PRIORITY

This application is a divisional of U.S. application Ser. No. 15/287,134 filed Oct. 6, 2016. The entire disclosures of U.S. application Ser. No. 15/287,134 are incorporated herein by reference.

BACKGROUND

Embodiments of the present invention relate to complementary metal oxide semiconductor (CMOS) technology, and more specifically, to incorporating vacuum channels into vertical transistors.

CMOS technology is used to construct integrated circuits such as microprocessors, microcontrollers, static random access memory (RAM) and other digital logic circuits. A basic component of CMOS designs is metal oxide semiconductor field effect transistors (MOSFETs). As MOSFETs are scaled to smaller dimensions, various designs and techniques are employed to improve device performance. Vertical transistors, in which source/drain regions are arranged on opposing ends of a vertical channel region, are attractive candidates for scaling to smaller dimensions.

SUMMARY

According to an embodiment, a method of fabricating features of a vertical transistor include performing a first etch process to form a first portion of a fin in a substrate; depositing a spacer material on sidewalls of the first portion of the fin; performing a second etch process using the spacer material as a pattern to elongate the fin and form a second portion of the fin in the substrate, the second portion having a width that is greater than the first portion; oxidizing a region of the second portion of the fin beneath the spacer material to form an oxidized channel region; and removing the oxidized channel region to form a vacuum channel.

According to another embodiment, a method of fabricating features of a vertical transistor include forming a fin in a substrate including a semiconductor material; oxidizing a portion of the semiconductor material of the fin such that an oxidized portion is arranged between a source and a drain; forming a gate stack on one side of the fin; removing the oxidized portion of the fin to form a vacuum channel opening, the vacuum channel opening contacting the gate stack; and performing a directional deposition process to deposit a dielectric on another side of the fin such that the vacuum channel opening remains open.

Yet, according to another embodiment, a vertical transistor includes a fin arranged on a source over a substrate; a drain arranged over the source such that the source and drain are arranged vertically with respect to one another; and a vacuum channel including an opening within the fin arranged between the source and the drain.

BRIEF DESCRIPTION OF THE DRAWINGS

The subject matter which is regarded as embodiments of the invention is particularly pointed out and distinctly claimed in the claims at the conclusion of the specification. The foregoing and other features, and advantages of the embodiments of the invention are apparent from the following detailed description taken in conjunction with the accompanying drawings in which:

FIGS. 1-24 illustrate exemplary methods of making vertical transistors according to embodiments, in which:

FIG. 1 is a cross-sectional side view of a substrate;

FIG. 2 is a cross-sectional side view after doping the substrate;

FIG. 3 is a cross-sectional side view after depositing a hard mask on the substrate;

FIG. 4 is a cross-sectional side view after forming a fin in the substrate;

FIG. 5 is a cross-sectional side view after forming spacers on sidewalls of the fin;

FIG. 6 is a cross-sectional side view after further etching the substrate to elongate the fin;

FIG. 7 is a cross-sectional side view after depositing an oxide layer and an insulating layer on the fin;

FIG. 8 is a cross-sectional side view after depositing a planarization layer;

FIG. 9 is a cross-sectional side view after partially removing the oxide layer and the insulating layer to expose the fin;

FIG. 10 is a cross-sectional side view after removing the planarization layer;

FIG. 11 is a cross-sectional side view after depositing an oxide on the fin;

FIG. 12 is a cross-sectional side view after oxidizing a portion of the fin;

FIG. 13 is a cross-sectional side view after planarizing and forming isolation regions;

FIG. 14 is a cross-sectional side view after partially removing the oxide;

FIG. 15 is a cross-sectional side view after performing a directional etch;

FIG. 16 is a cross-sectional side view after forming gate stacks;

FIG. 17 is a cross-sectional side view after partially recessing the gate stacks;

FIG. 18 is a cross-sectional side view after depositing and patterning a mask over the gate stacks;

FIG. 19 is a cross-sectional side view after removing the exposed gate stack;

FIG. 20 is a cross-sectional side view after removing the oxidized portions of the fin in the channel region;

FIG. 21 is a cross-sectional side view after removing the mask;

FIG. 22 is a cross-sectional side view after performing a directional deposition of a dielectric;

FIG. 23 is a cross-sectional side view after depositing an oxide and planarizing; and FIG. 24 is a cross-sectional side view after forming contacts.

DETAILED DESCRIPTION

Figure 1:
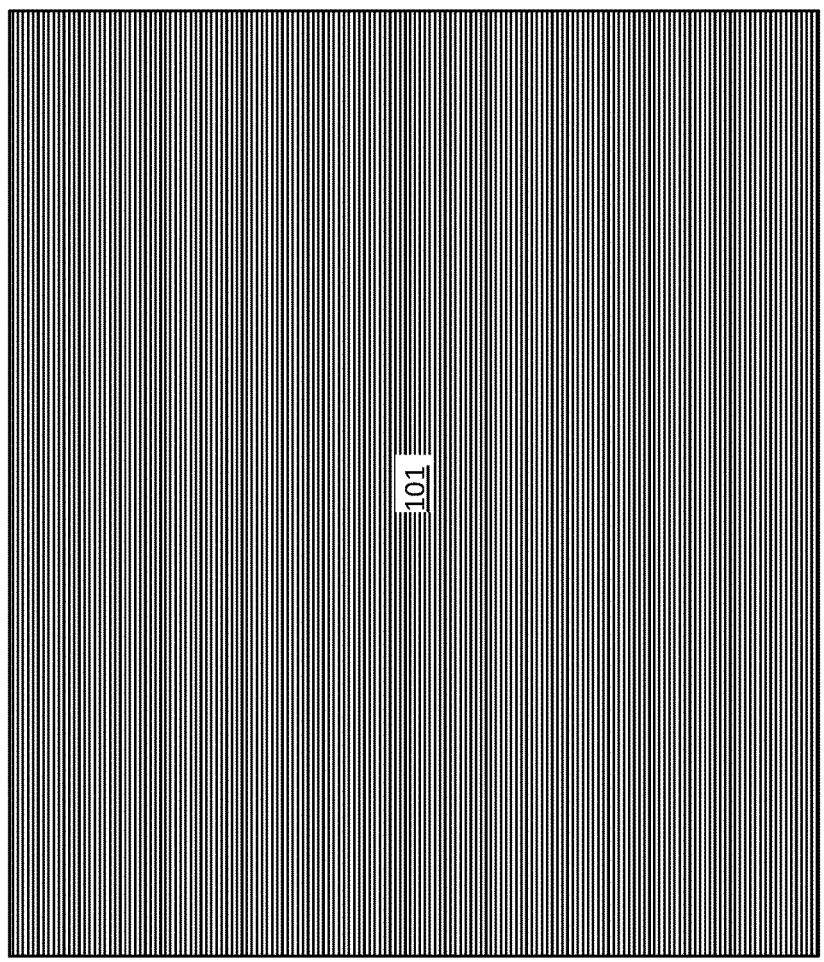

Embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to aspects of the present invention, vacuum channel transistors include an open channel region. A vacuum channel transistor can be fabricated by etching a cavity in doped silicon. The cavity is bordered by a source electrode, a gate electrode, and a drain electrode. The source and drain are separated by a space, and the gate is over the space. Electrons are emitted from the source due to a voltage applied across the source and the drain, and the gate controls the electron flow across the cavity. When the space between the source and drain is sufficiently large (e.g., about 150 nm) the electrons do not collide, which means that the mean free path of the electrons (i.e., the average length an electron can travel before hitting something) is more than 1 μm.

Vacuum channel transistors are advantageous for several reasons. Compared to other semiconductor transistors, vacuum channel transistors can function at speeds that are many orders of magnitude faster. Vacuum channel transistors can also operate at higher frequencies, for example, terahertz frequencies, which can be beyond the reach of solid-state devices. While electrons in a solid state transistor suffer from collisions with atoms, which is also called crystal-lattice scattering, electrons freely propagate in the open channel space of a vacuum transistor. Additionally, vacuums are not susceptible to radiation damage that can damage semiconductors. Vacuums also produce less noise and distortion than solid-state materials.

Although vacuum channels can be used in planar transistor devices, there are disadvantages compared to using vacuum channels in vertical transistors. For example, the large areas of the source/drain limit the ability to use the devices in integrated circuits. Also, the cathode/anode tips that are made of silicon processing for "electron" thermionic emission are not sharp enough to produce efficient field emissions to justify the power/performance needs for modern transistors.

Accordingly, various embodiments of the present invention provide transistors, and methods of making transistors, with a vertically integrated vacuum channel. Compared to planar devices, the vertical devices described herein have a smaller footprint, for example, of the nanometer scale. In embodiments, vertical vacuum devices also have channel areas that are formed by oxidation processes, which are reliable methods for generating angled channel tips for electron field emission. The described vacuum devices are also fully compatible with state-of-the art CMOS technology, which makes the devices ideal candidates for highly scaled transistor architecture.

FIGS. 1-24 illustrate exemplary methods of making vertical transistors according to embodiments. FIG. 1 is a cross-sectional side view of a substrate 101. The substrate 101 can include one or more semiconductor materials. In an exemplary embodiment, the substrate 101 includes silicon. Other non-limiting examples of suitable substrate 101 materials include SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

Figure 2:
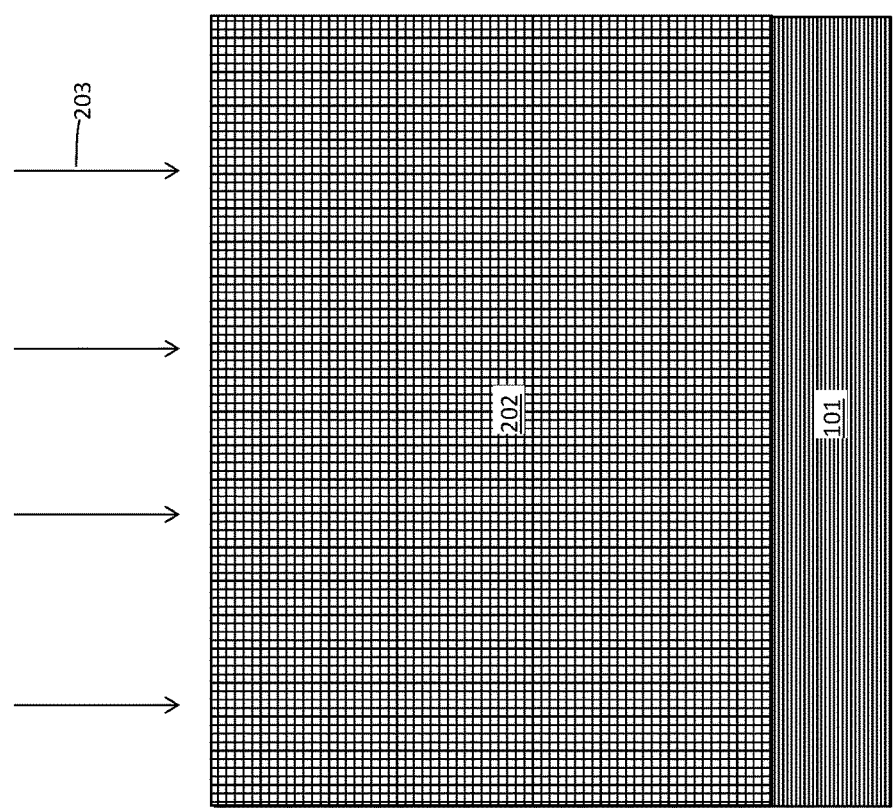

FIG. 2 is a cross-sectional side view after doping the substrate 101 with a dopant 203. Doping the substrate 101 forms a doped region 202 in the substrate 101. The doped region 202 can form source regions and/or drain regions. In addition to doping the substrate 101 as shown, a source/drain can be formed on the substrate 101 by forming an epitaxial growth on the substrate 101 in some embodiments. When dopants 203 are used, the substrate 101 can be heavily doped with one or more dopants 203. The dopants 203 can be p-type dopants or n-type dopants.

Figure 3:
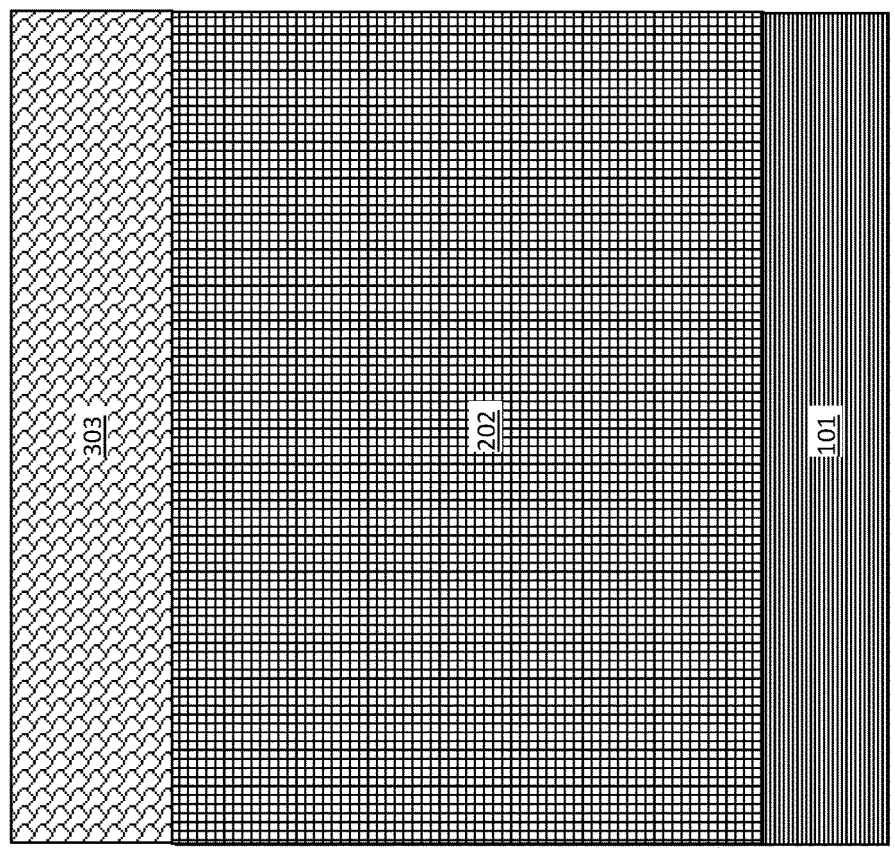

FIG. 3 is a cross-sectional side view after depositing a hard mask 303 on the substrate 101 over the doped region 202. The hard mask 303 can be, for example, a dielectric nitride such as silicon nitride. The hard mask 303 can be deposited by a deposition process including, but not limited to chemical vapor deposition (CVD), physical vapor deposition (PVD), plasma enhanced CVD, atomic layer deposition (ALD), evaporation, chemical solution deposition, or like processes.

Figure 4:
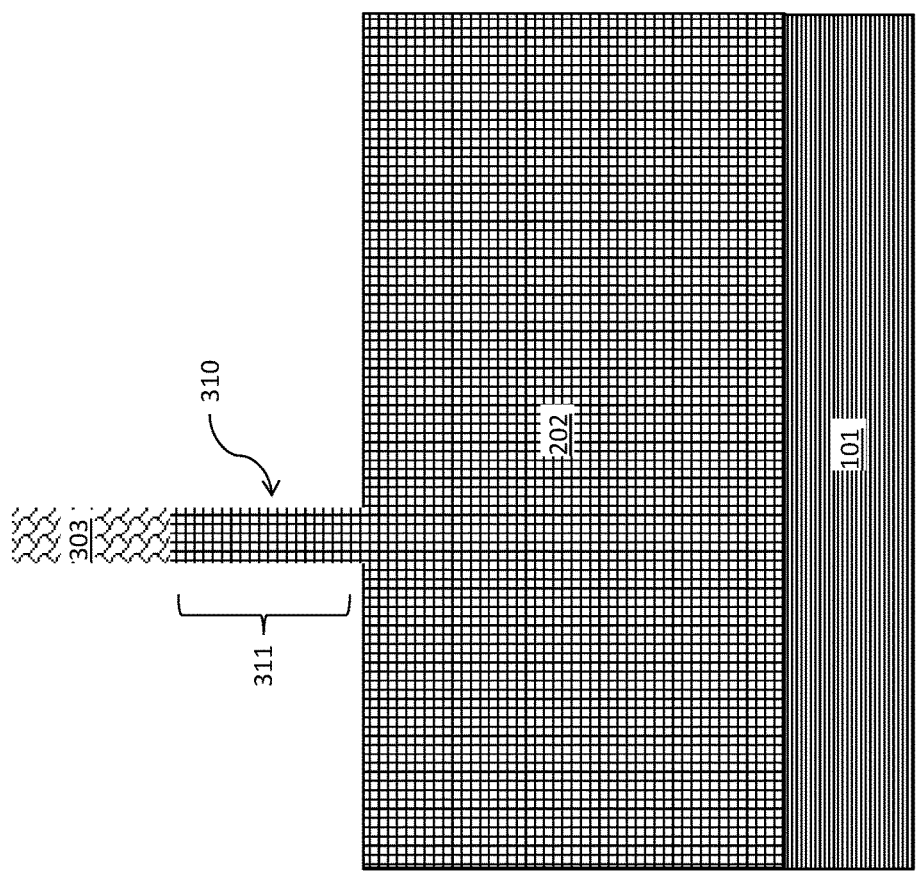

FIG. 4 is a cross-sectional side view after forming a fin 310 in the substrate 101 by a first etching process. The fin 310 is formed by lithography and etching by, for example, reactive ion etching (RIE). The first etch process forms a first portion 311 (top portion) of the fin 310. Although one fin 310 is shown, any number of fins, or an array of fins can be formed in the substrate 210. The first portion 311 of the fin 310 includes a hard mask cap formed by the hard mask 303.

Figure 5:
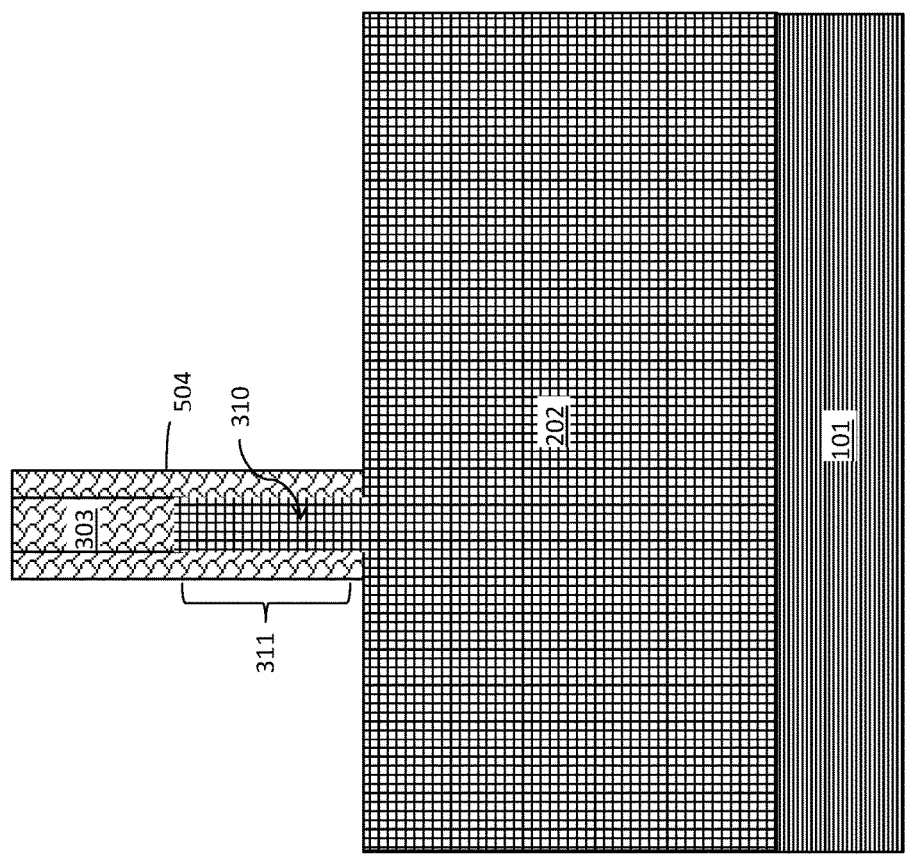

FIG. 5 is a cross-sectional side view after forming spacers 504 on sidewalls of the fin 310. The spacers 504 can be formed by first depositing dielectric layers and then performing an anisotropic process. The spacers 504 are arranged on sidewalls of the first portion 311 of the fin 310. The spacers 504 extend from the doped region 202 to a surface of the hard mask 303 cap on the fin 310. The spacers 504 can include an insulating material, for example, silicon dioxide, silicon nitride, SiOCN, or SiBCN. The spacer 504 material can be deposited by a deposition process, for example, CVD or PVD.

Figure 6:
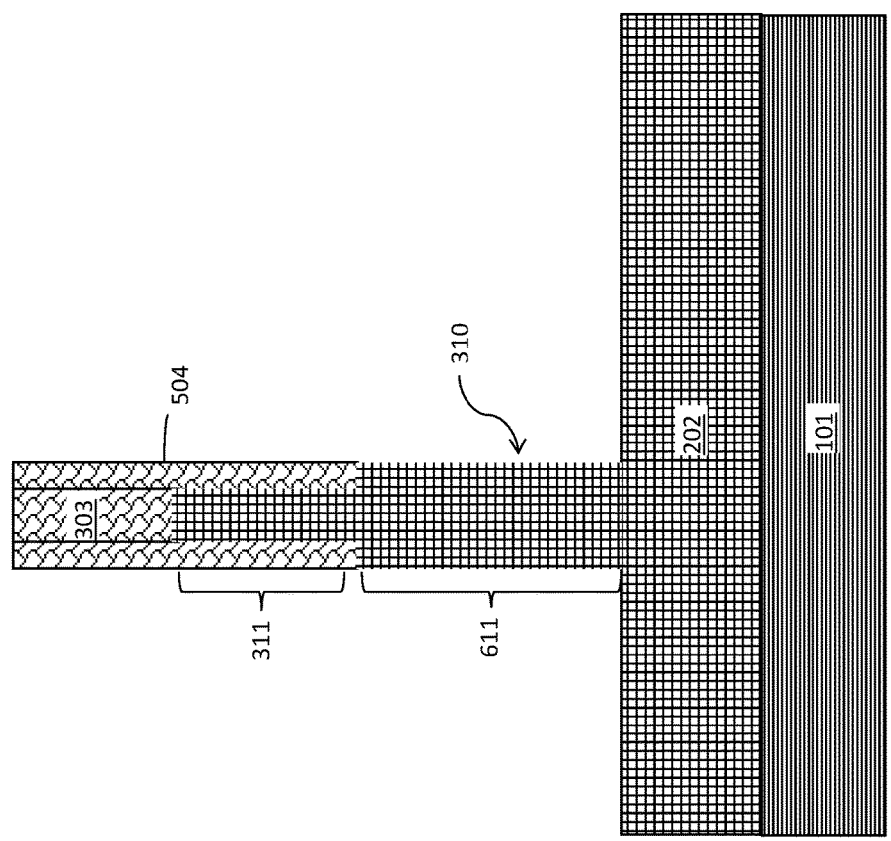

FIG. 6 is a cross-sectional side view after further etching the doped region 202 of the substrate 101 to elongate the fin 310. A second fin etch process is performed using the spacer 504 as a pattern to form a second portion 611 (bottom portion) of the fin 310. Further etching the substrate 101 in the doped region 202 exposes semiconductor material beneath the spacers 504. As shown, a "stepped" fin structure is formed. The second portion 611 (bottom portion) of the fin 310 has a width that is greater than the first portion 311 (top portion). The "stepped" fin structure can be used for both the anode and the cathode of a device.

When the substrate 101 is doped as shown in FIG. 2 before performing the first etch process, the dopant extends from a region below the fin 310 to a top surface of the first portion 311 of the fin 310. The doping can then form both the source below the fin 310 and the drain. The drain is arranged over the source such that the source and drain are arranged vertically with respect to one another.

Figure 7:
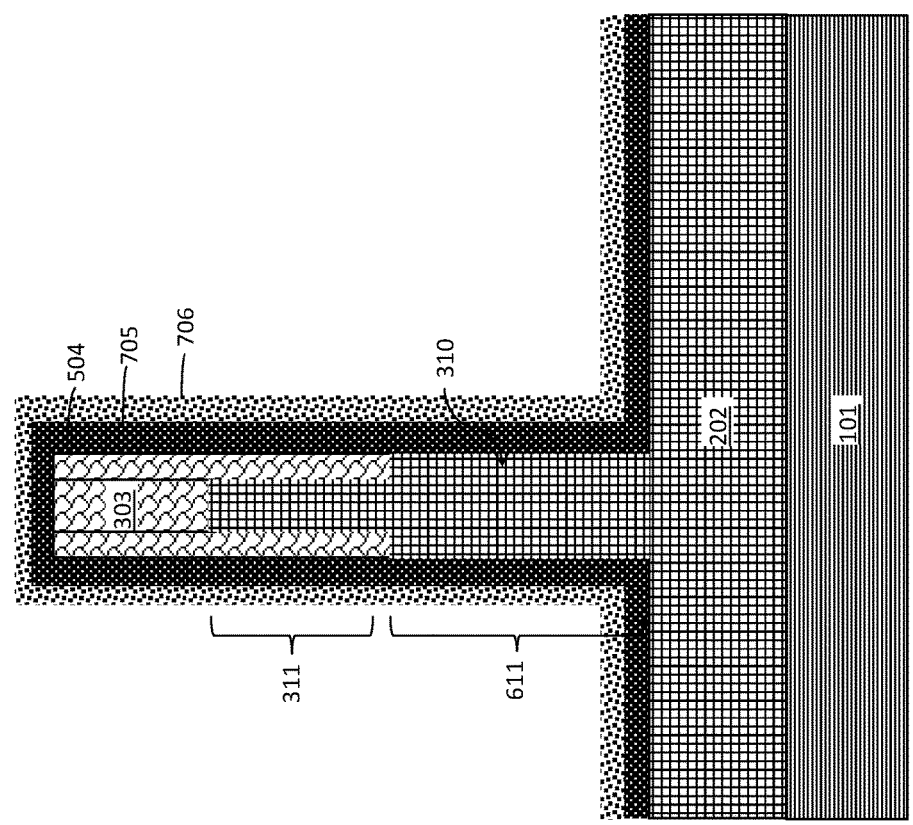

FIG. 7 is a cross-sectional side view after depositing an oxide layer 705, followed by an insulating layer 706 on the fin 310. Non-limiting examples of oxides for the oxide layer 705 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an ALD process, or any combination thereof. Non-limiting examples of insulating layers 706 include silicon nitride, silicon oxide, silicon dioxide, aluminum oxide, or a combination thereof. In an exemplary embodiment, the oxide layer 705 is an ALD oxide, and the insulating layer 706 is silicon nitride.

Figure 8:
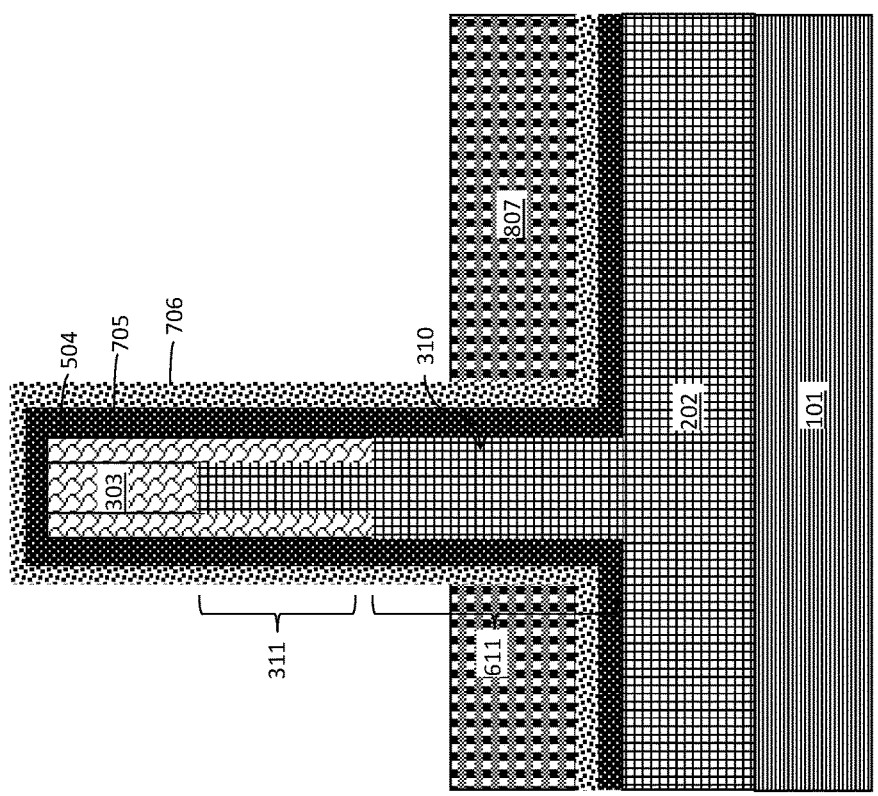

FIG. 8 is a cross-sectional side view after depositing a planarization layer 807. The planarization layer 807 can be, for example, an organic planarization layer (OPL) coating or other suitable spin-on coating. The planarization layer 807 can include an organic material, for example, a polymeric material.

The planarization layer 807 is deposited on the fin 310 and substrate 101 and then etched back to partially expose the fin 310 having the oxide layer 705 and the insulating layer 706 disposed thereon. The planarization layer 807 is partially removed by performing dry etching process (e.g., RIE).

Figure 9:
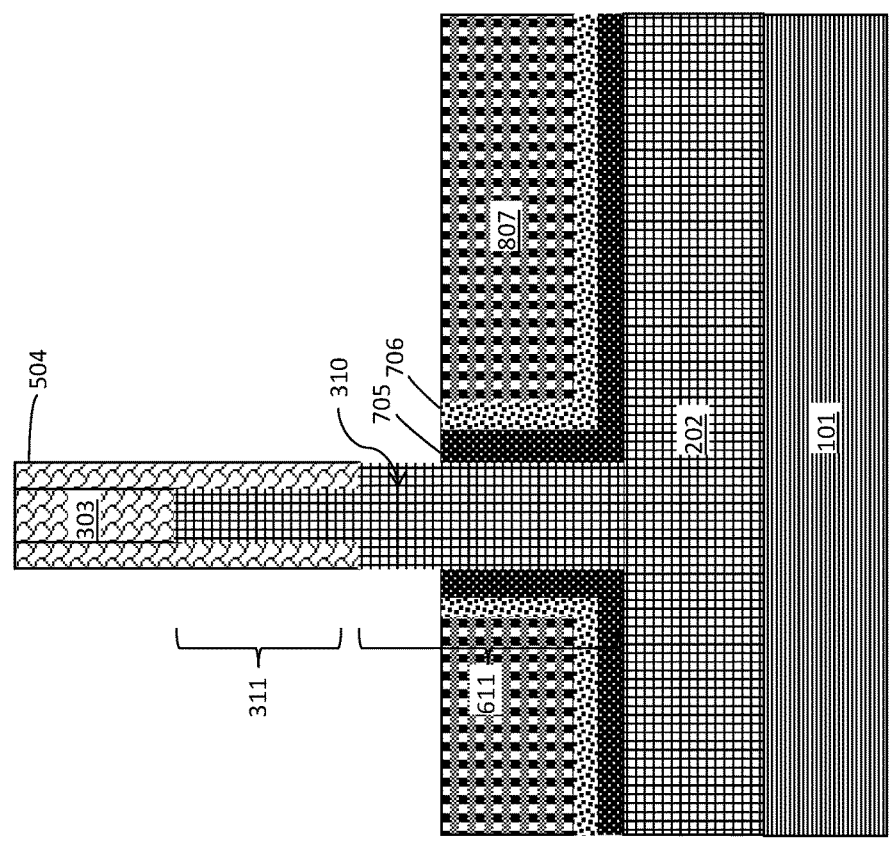

FIG. 9 is a cross-sectional side view after partially removing the oxide layer 705 and the insulating layer 706 to expose the fin 310 with spacers 504 disposed thereon. The oxide layer 705 and the insulating layer 706 are removed from fin 310 sidewalls down to the level of the planarization layer 807. The second portion 611 of the substrate 101 is exposed beneath the spacers 504. The insulating layer 706 can be removed by etching, for example, by a hot orthophosphoric acid ($H_3PO_4$) wet etch process, which efficiently removes silicon nitride films. The oxide layer 705 can be removed by etching, for example, using a buffered HF solution to remove the oxide layer.

Figure 10:
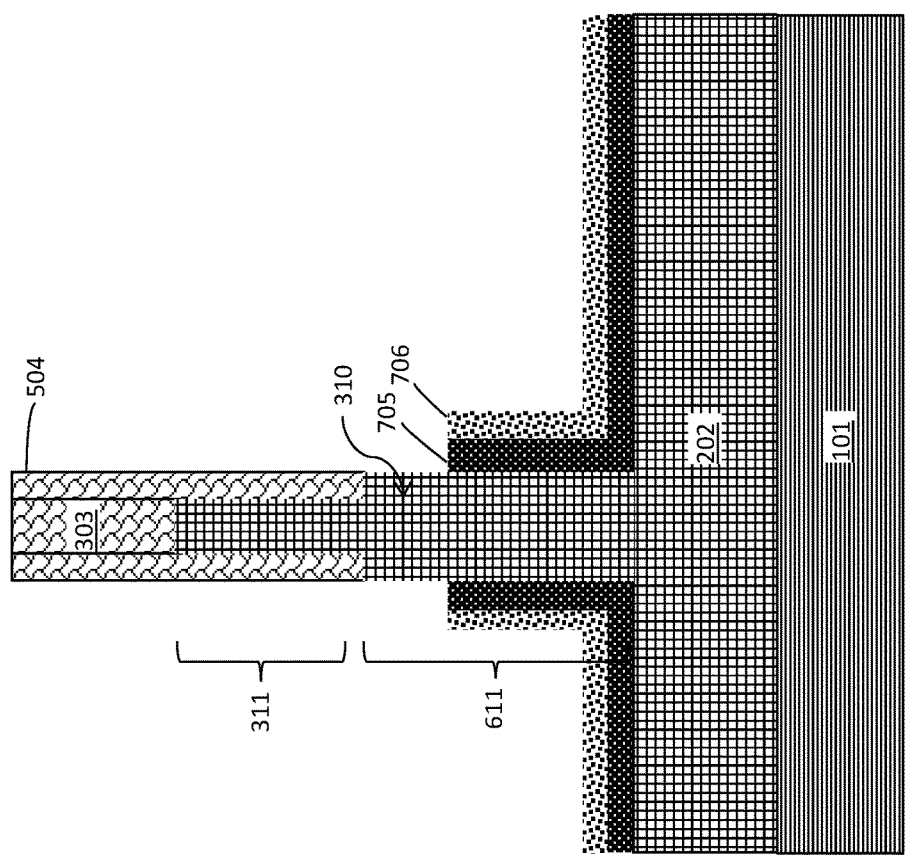

FIG. 10 is a cross-sectional side view after removing the planarization layer 807. The planarization layer 807 can be removed by dry etching, such as RIE, or by ashing. Removing the planarization layer 807 exposes the insulating layer 706 over the doped region 202.

Figure 11:
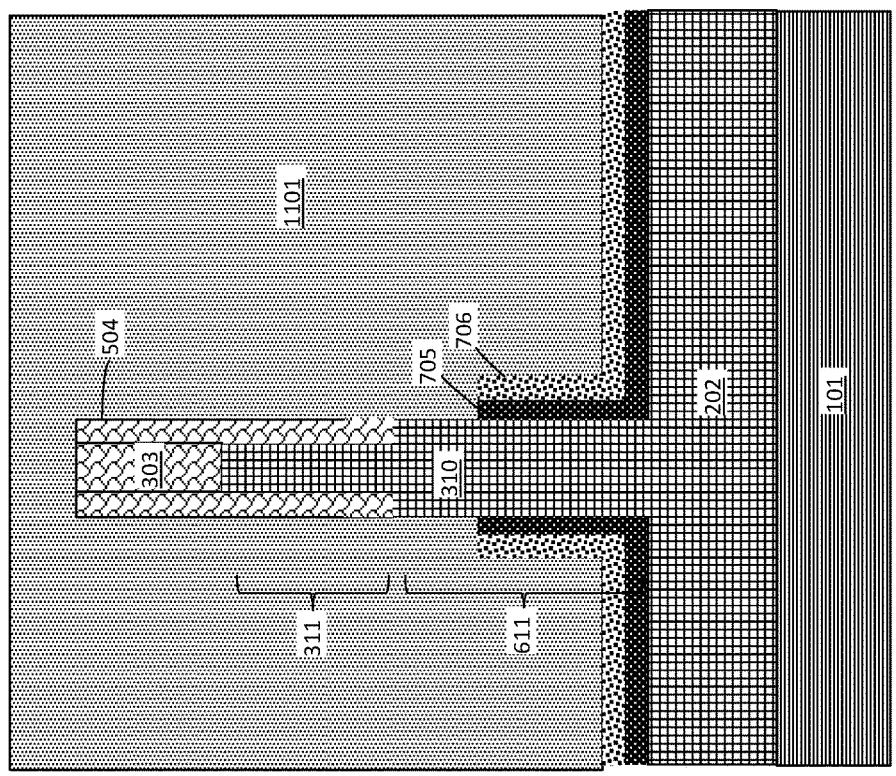

FIG. 11 is a cross-sectional side view after depositing an oxide 1101 onto and around the fin 310 and onto the substrate 101. The oxide 1101 can be, for example, a flowable oxide. The oxide 1101 contacts sidewalls of the second portion 611 of the fin 310. The oxide 1101 can also be any other low-k dielectric, including but not limited to, silicon oxide, spin-on-glass, a flowable oxide, a high density plasma oxide, borophosphosilicate glass (BPSG), or any combination thereof. The oxide 1101 or low-k dielectric is deposited by a deposition process, including, but not limited to CVD, PVD, plasma enhanced CVD, ALD, evaporation, chemical solution deposition, or like processes.

Figure 12:
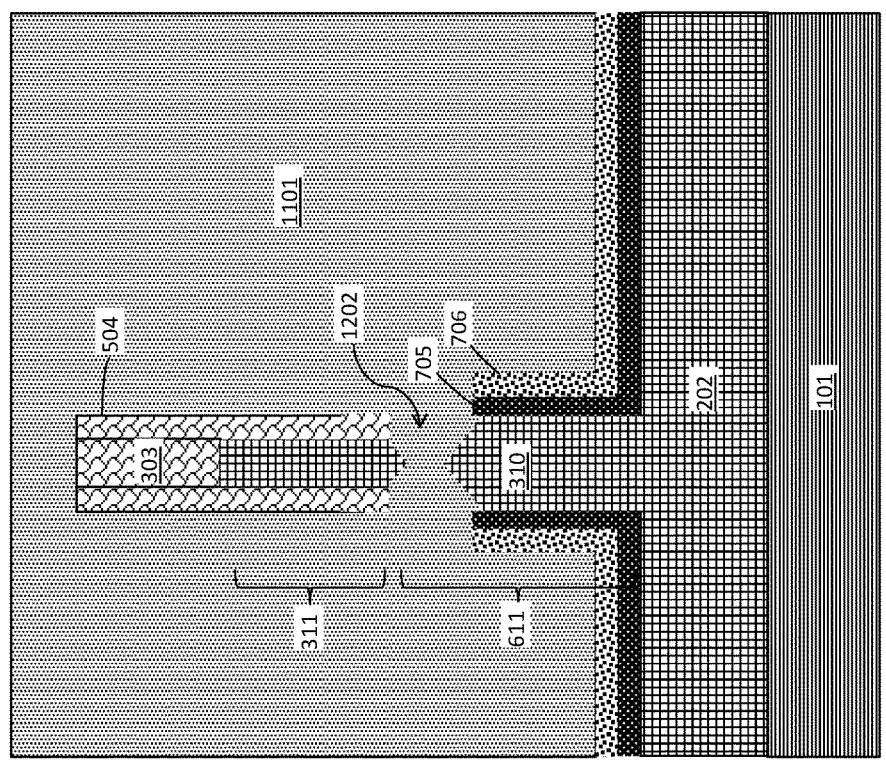

FIG. 12 is a cross-sectional side view after oxidizing a portion of the second portion 611 of the fin 310. The exposed doped regions 202 of the substrate 101 including semiconductor material(s) are oxidized. The oxidized regions are beneath the spacers 504. The oxidation forms triangular oxidation regions 1202 on each exposed side of the fin 310. The oxidation regions 1202 are arranged between a source and a drain formed by doping before forming the fin (as shown in FIG. 2). Oxidation of the semiconductor material can be performed by a high temperature anneal process. The high temperature anneal can be performed at a temperature from about 100 to about 1000° C. The high temperature anneal can be performed in the ambient atmosphere including oxygen and/or in the presence of $H_2O$ or $NH_3$.

A pair of triangular oxidation regions 1202 is formed in the exposed semiconductor material regions of the second portion 611 of the fin 310. The triangular oxidation regions 1202 are formed tip-to-tip.

Figure 13:
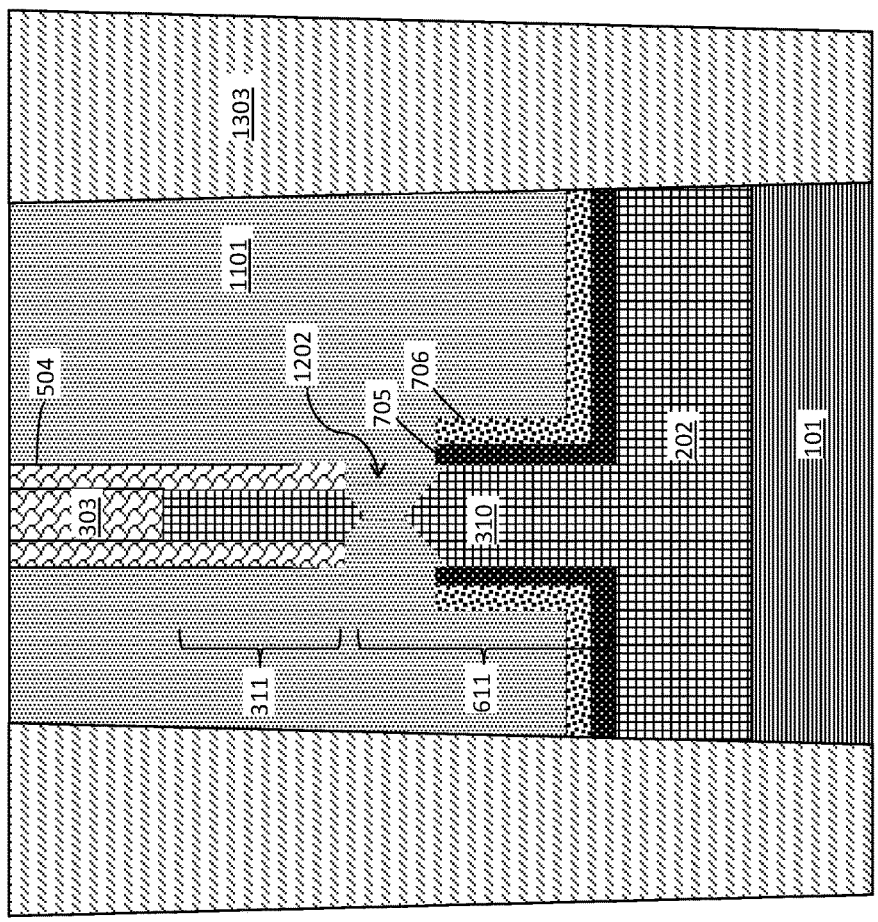

FIG. 13 is a cross-sectional side view after planarizing and forming isolation regions 1303. The planarization process can be, for example, chemical mechanical planarization (CMP). The planarization process polishes the surface of the oxide 1101 and removes the oxide 1101 down to the level of the hard mask 303.

The isolation regions 1303 separate individual transistor devices that are formed on the same substrate 101. The isolation regions can be shallow trench isolation (STI) regions. The isolation regions 1303 are formed by etching trenches through the oxide 1101 and to the substrate 101 and then filling the trenches with at least one dielectric material, for example, silicon dioxide. Other non-limiting examples of suitable dielectric materials for the isolation regions 1303 include tetraethylorthosilicate (TEOS) oxide, high aspect ratio plasma (HARP) oxide, silicon oxide, high temperature oxide (HTO), high density plasma (HDP) oxide, oxides formed by an ALD process, silicon nitride, silicon oxynitride, or any combination thereof.

Figure 14:
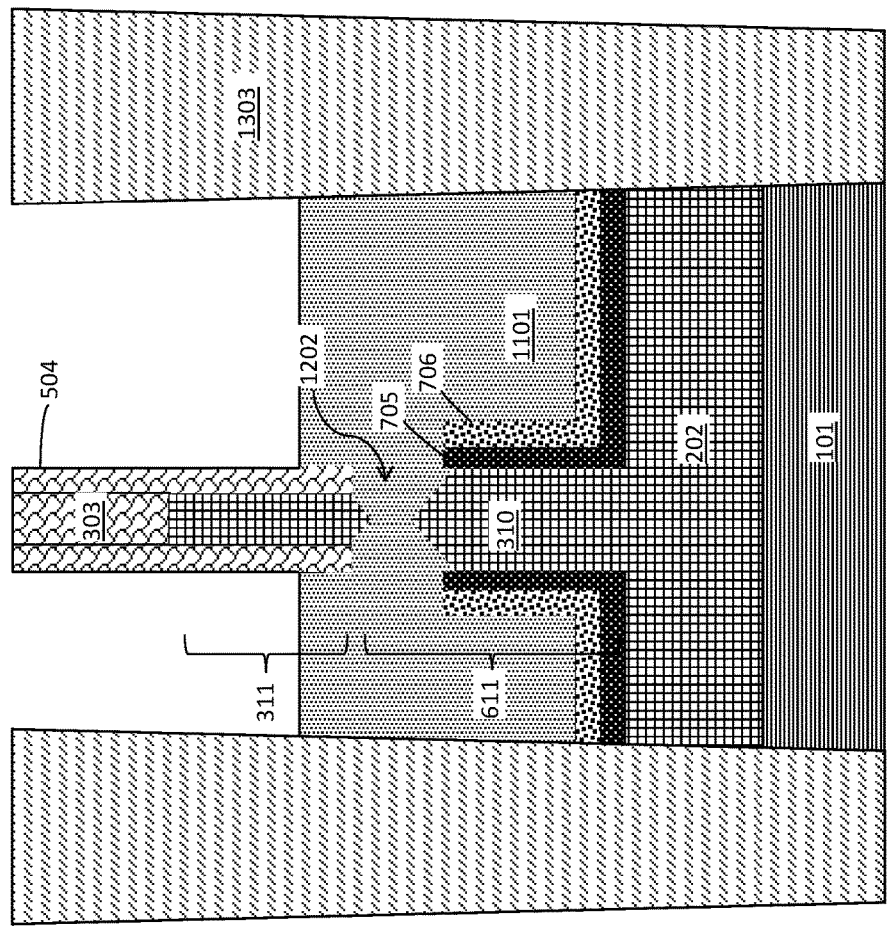

FIG. 14 is a cross-sectional side view after partially removing the oxide 1101. The oxide 1101 is removed by a partial etch back process. The oxide 1101 etch back is performed by a process that is selective to the materials forming the hard mask 303 and spacers 504. For example, in embodiments where the hard mask 303 and spacers 504 are nitride, the etch back process is selective to nitride. The oxide 1101 is etched back to a level above the triangular oxidation regions 1202.

The oxide 1101 etch back process is an isotropic etch that can be a wet etch process, a dry etch process, or both. Non-limiting examples of isotropic etchants include buffered hydrofluoric acid (BHF), hydrofluoric nitric acid (HNA), and phosphoric acid. Isotropic dry etching processes include, for example, AMAT Frontier silicon etching processes.

Figure 15:
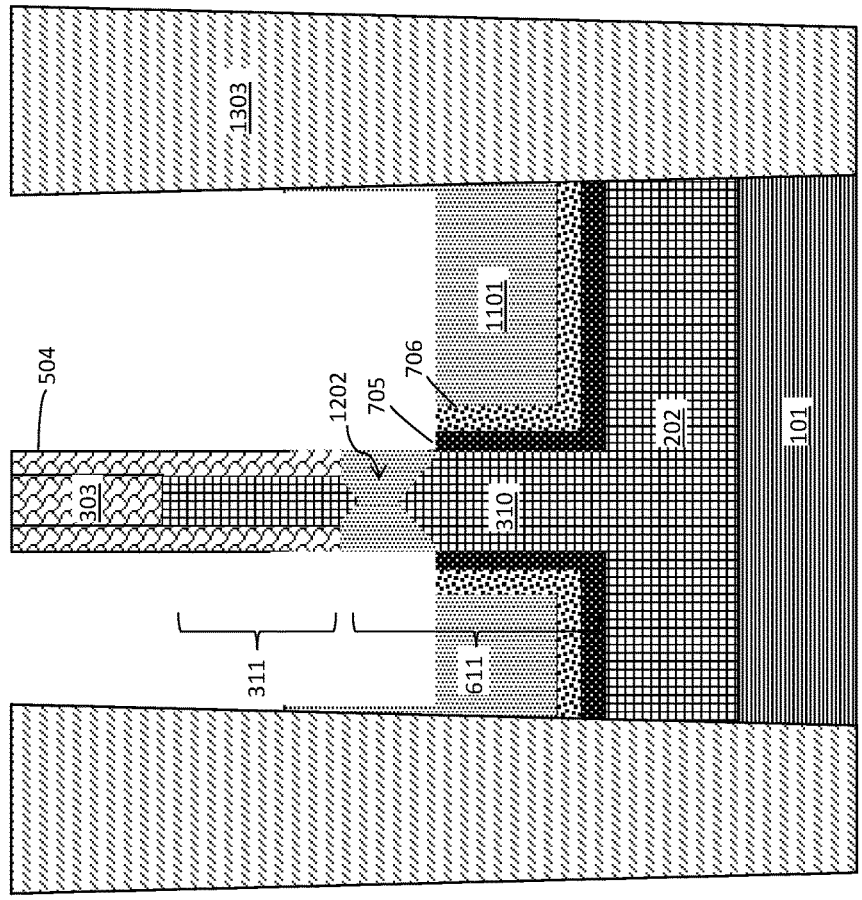

FIG. 15 is a cross-sectional side view after performing a directional etch to further remove portions of the oxide 1101. The directional etch is an anisotropic etch process. An anisotropic etch process is a material removal process in which the etch rate in the direction normal to the surface to be etched is greater than in the direction parallel to the surface to be etched. The anisotropic etch can include RIE. Other non-limiting examples of anisotropic etching processes include ion beam etching, plasma etching, laser ablation, or any combination thereof. The oxide 1101 is removed down to a level below or adjacent to the triangular oxidation regions 1202.

Figure 16:
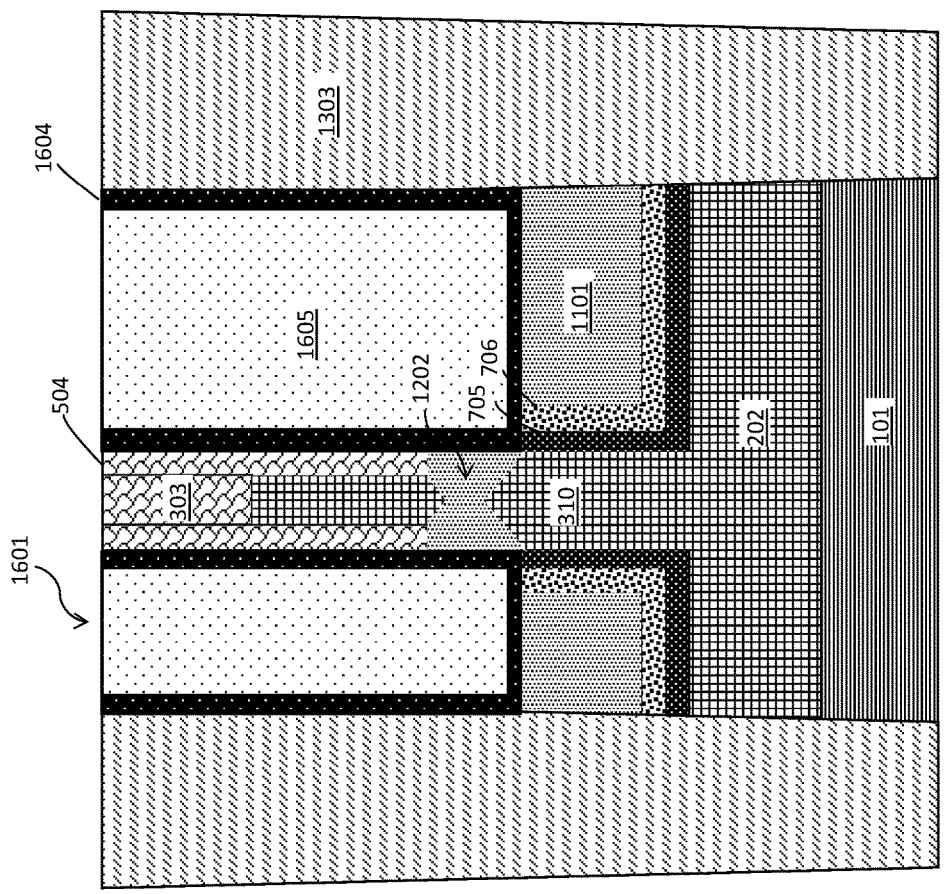

FIG. 16 is a cross-sectional side view after forming gate stacks 1601 in the openings formed on opposing sides of the fin 310. Each gate stack 1601 can include one or more layers. In exemplary embodiments, the gate stack 1601 includes a gate dielectric 1604 and one or more gate metals 1605.

The gate dielectric 1604 is disposed directly on the oxide 1101 in each opening formed between the isolation region 1303 and the fin 310. The gate dielectric 1604 can be a dielectric material having a dielectric constant greater than 3.9, 7.0, or 20.0. Non-limiting examples of suitable materials for the gate dielectric 1604 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum. The gate dielectric 1604 can be formed by suitable deposition processes, for example, CVD, PECVD, ALD, PVD, chemical solution deposition, or other like processes. The thickness of the gate dielectric 1604 can vary depending on the deposition process as well as the composition and number of high-k dielectric materials used.

The gate metals 1605 are disposed on the gate dielectric 1604 and fill the openings between the fin 310 and the isolation regions 1303 to form the gate stacks 1601. The gate metals 1605 can include one or more work function metals and one or more gate metals. The work function metal(s) can be disposed over the gate dielectric 1604. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

A conductive gate metal is then deposited onto the work function metal(s). Non-limiting examples of suitable conductive metals include aluminum (Al), platinum (Pt), gold (Au), tungsten (W), titanium (Ti), or any combination thereof. The conductive metal can be deposited by a suitable deposition process, for example, CVD, PECVD, PVD, plating, thermal or e-beam evaporation, and sputtering. A planarization process, for example, CMP, is performed to polish the surface of the conductive gate metal material and form the final gate stacks 1601.

Figure 17:
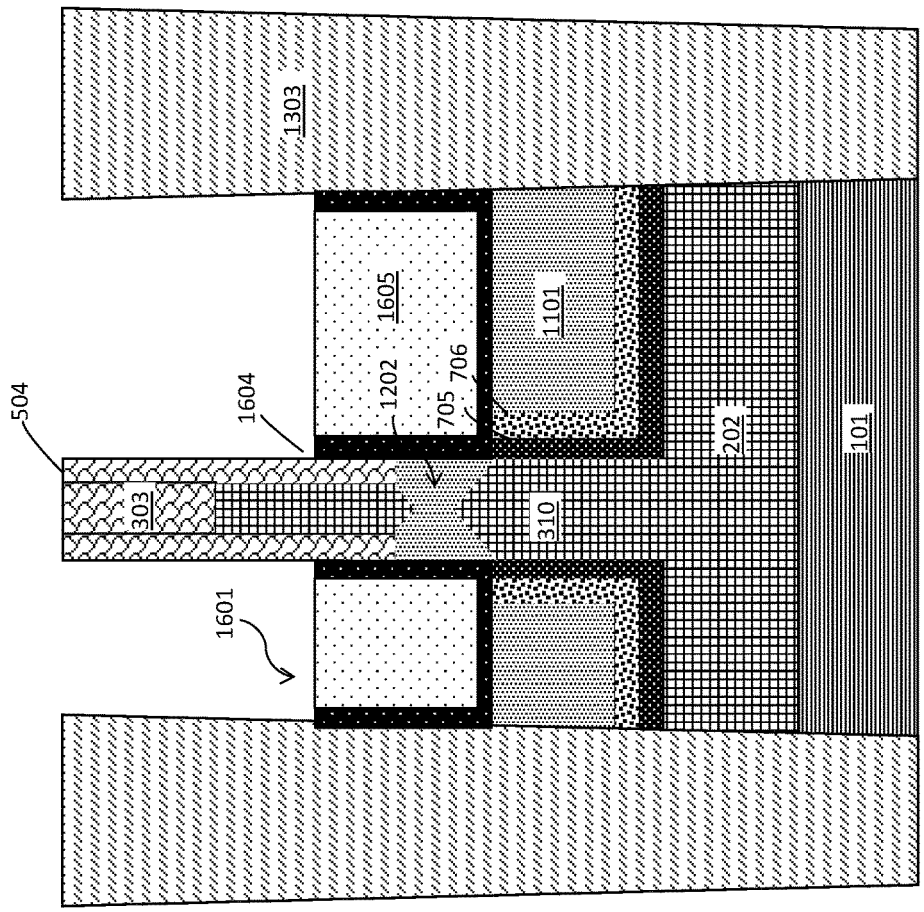

FIG. 17 is a cross-sectional side view after partially recessing the gate stacks 1601. Each gate stack on opposing sides of the fin 310 is recessed to a level above the triangular oxidation regions 1202. The recessing or etching processes employed depend on the composition of the gate stacks 1601. One or more etching processes can be employed. In exemplary embodiments, the gate stacks can be recessed by RIE.

Figure 18:
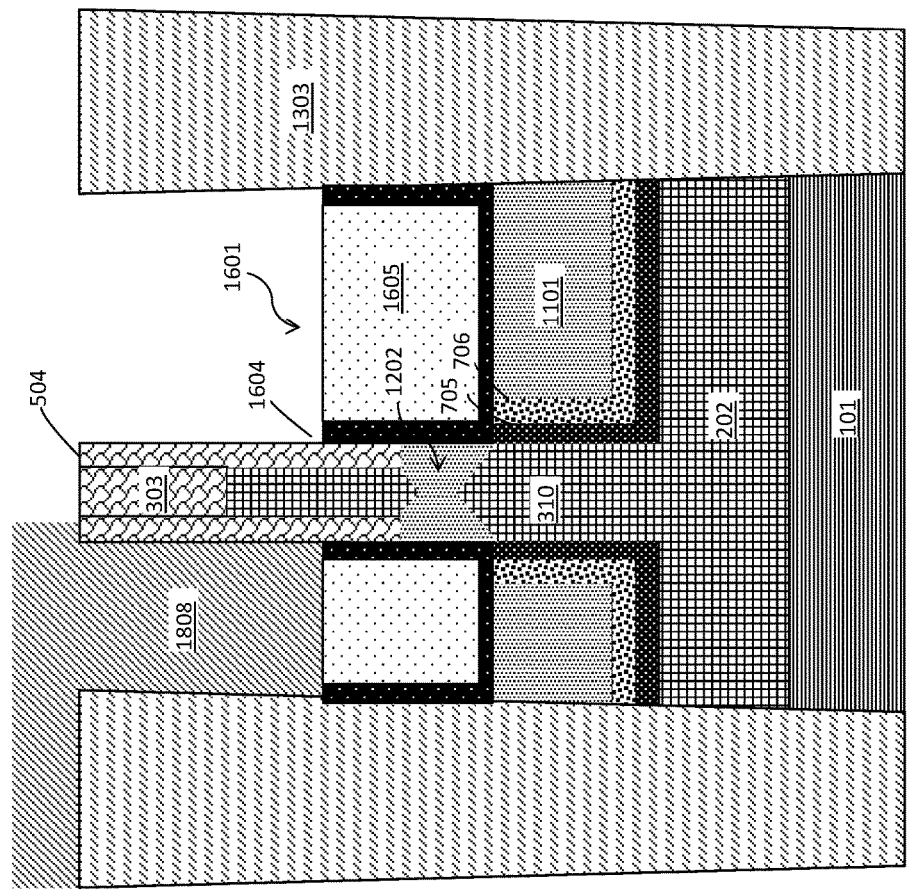

FIG. 18 is a cross-sectional side view after depositing and patterning a mask 1808 over the recessed gate stacks 1601. The mask 1808 can be an OPL. The mask 1808 can be another suitable spin-on coating or can include an organic material, for example, a polymeric material. The mask 1808 is deposited in the openings over the recessed gate stacks 1601, and then the mask 1808 is patterned such that one gate stack 1601 is protected and another gate stack 1601 is exposed on each side of the fin 310.

The mask 1808 is patterned by disposing an etch mask (not shown) over the mask 1808. The etch mask (not shown) can be a resist material, for example, a photoresist material. The mask 1808 is patterned by removing the mask 1808 material by, for example, a dry etching process (e.g., RIE).

Figure 19:
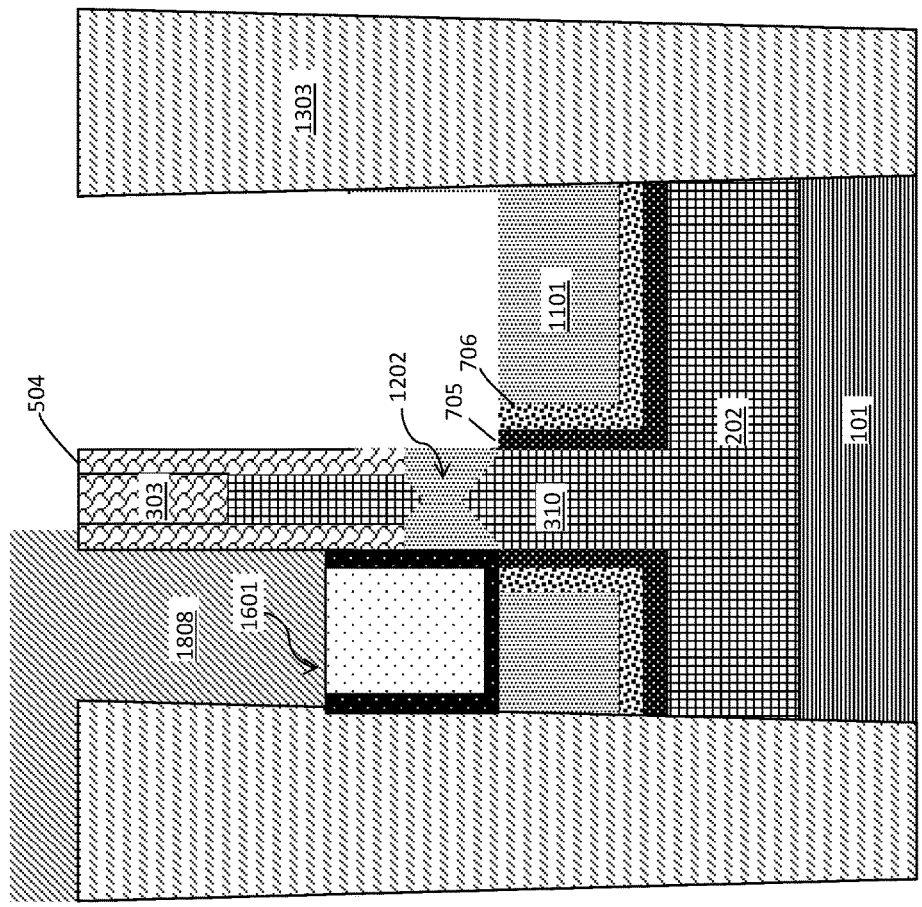

FIG. 19 is a cross-sectional side view after removing the exposed gate stack 1601 on one side of the fin 310. A single gate stack 1601 is left on one side of the fin 310. The layers of the gate stack 1601 can be removed by sequential etch process that depend on the gate materials and metals. A combination of RIE processes can be performed to remove the exposed gate stack 1601 on the other side of the fin 310. After removing the exposed gate stack 1601, the oxide 1101 material over the substrate 101 on one side of the fin 310 is exposed.

Figure 20:
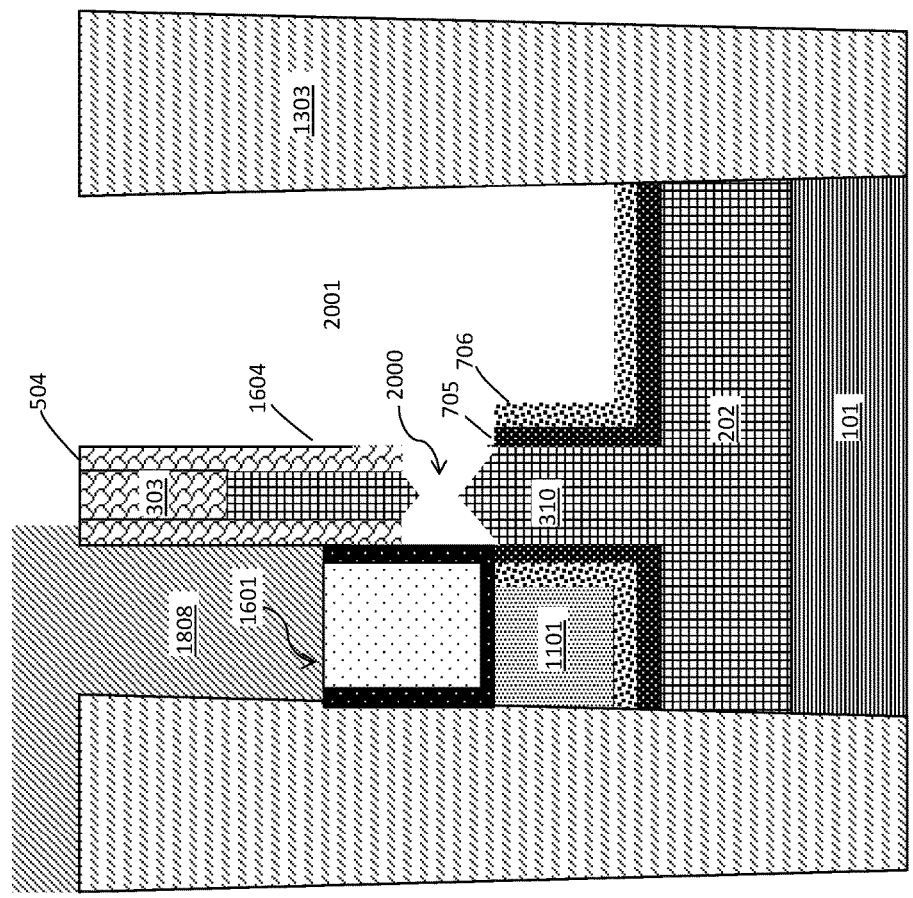

FIG. 20 is a cross-sectional side view after removing the oxidized portions of the fin 310 in the channel region. The mask 1808 remains in place to protect the gate stack 1601 on one side of the fin 310. A selective wet etch process can be employed to remove the triangular oxidation regions 1202 within the fin 310 (see FIG. 19). Removing the triangular oxidation regions 1202 forms a vacuum cavity 2000 (vacuum channel opening) within the fin 310. The vacuum cavity is an opening within the fin 310 that extends from (and contacts) the gate stack 1601 on one side to the opening 2001 on the other side.

The selective wet etch process can include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

Figure 21:
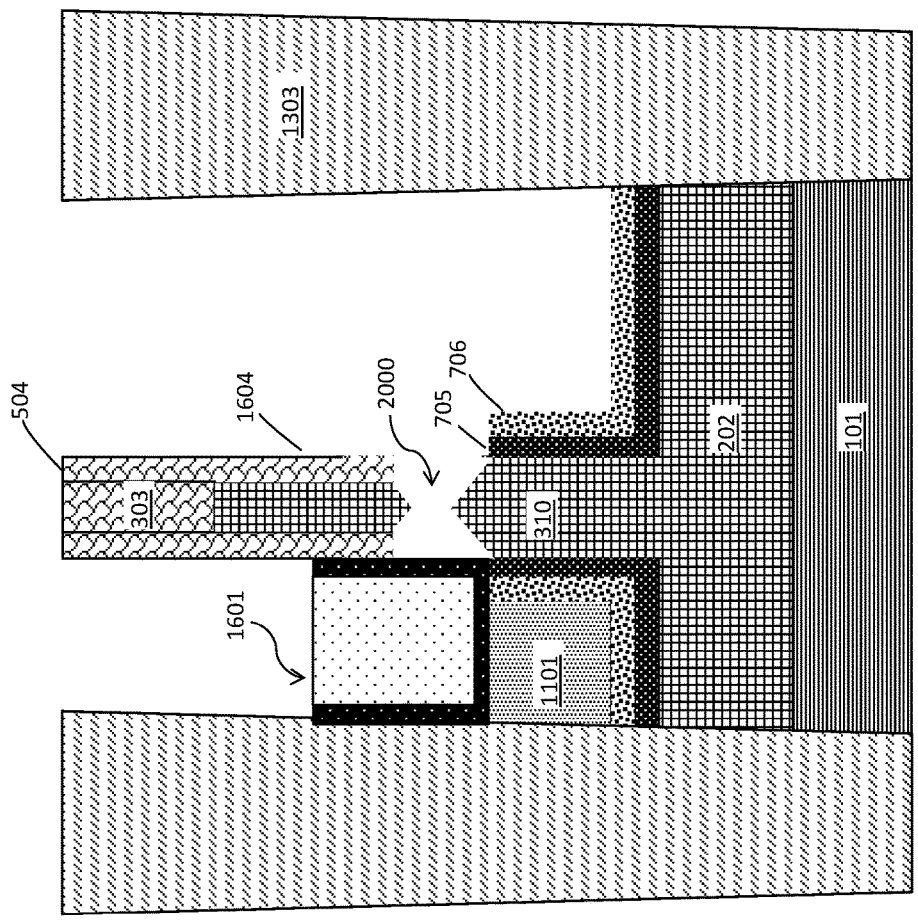

FIG. 21 is a cross-sectional side view after removing the mask 1808 to expose the gate stack 1601. The mask 1808 can be stripped by ashing. Ashing can be used to remove a photoresist material, amorphous carbon, or organic planarization (OPL) layer. Ashing is performed using a suitable reaction gas, for example, $O_2$, $N_2$, $H_2/N_2$, $O_3$, $CF_4$, or any combination thereof. Removing the mask 1808 exposes the remaining gate stack 1601.

Figure 22:
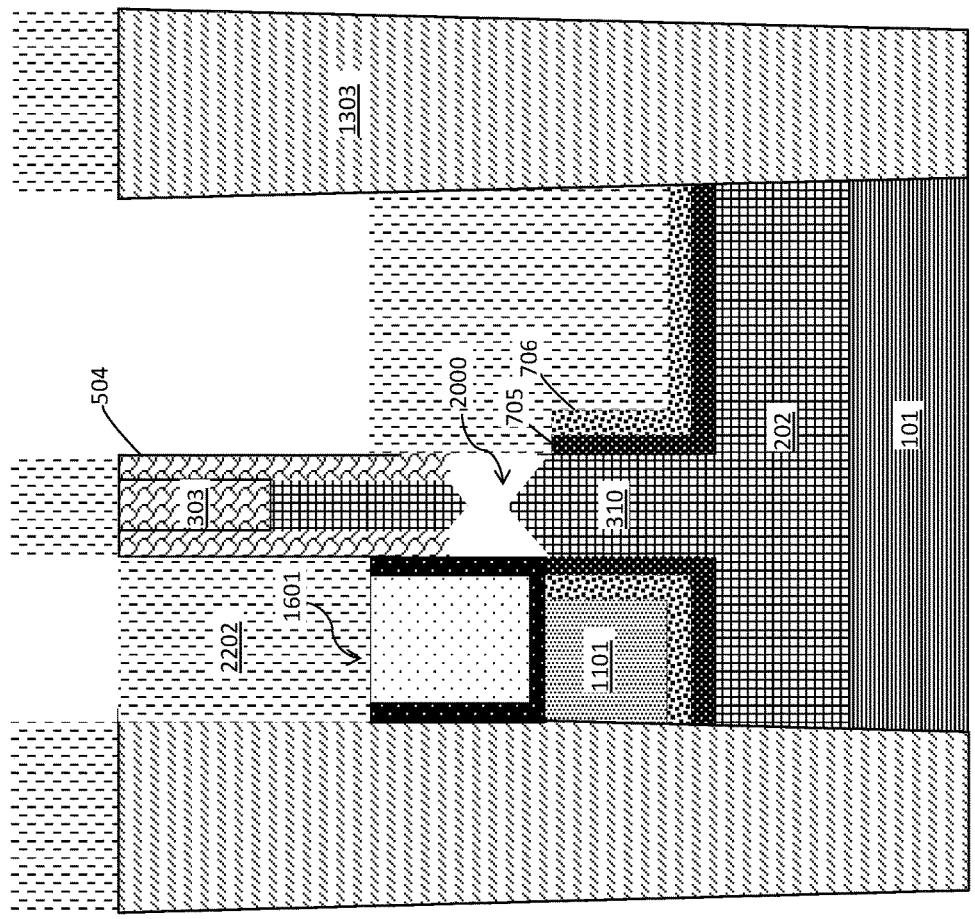

FIG. 22 is a cross-sectional side view after performing a directional deposition of a dielectric 2202. The dielectric 2202 is deposited by a directional process such that the dielectric 2202 is deposited only on upper surfaces and not deposited on sidewalls of the openings on opposing sides of the fin 310.

Non-limiting examples of dielectrics 2202 include silicon nitride, SiOCN, SiBCN, or a combination thereof. One directional deposition method that can be used to deposit silicon nitride, for example, is gas cluster ion beam (GCIB) deposition.

After depositing the dielectric 2202 in the openings on opposing sides of the fin 310, the vacuum cavity 2000 remains as an open vacuum channel region within the fin 310. The dielectric 2202 fills the opening over the gate stack 1601 on one side of the fin 310. The dielectric 2202 partially fills the opening arranged on the other side of the fin 310. The dielectric 2202 separates the source region beneath the fin 310 from the drain region at the top of the fin.

Figure 23:
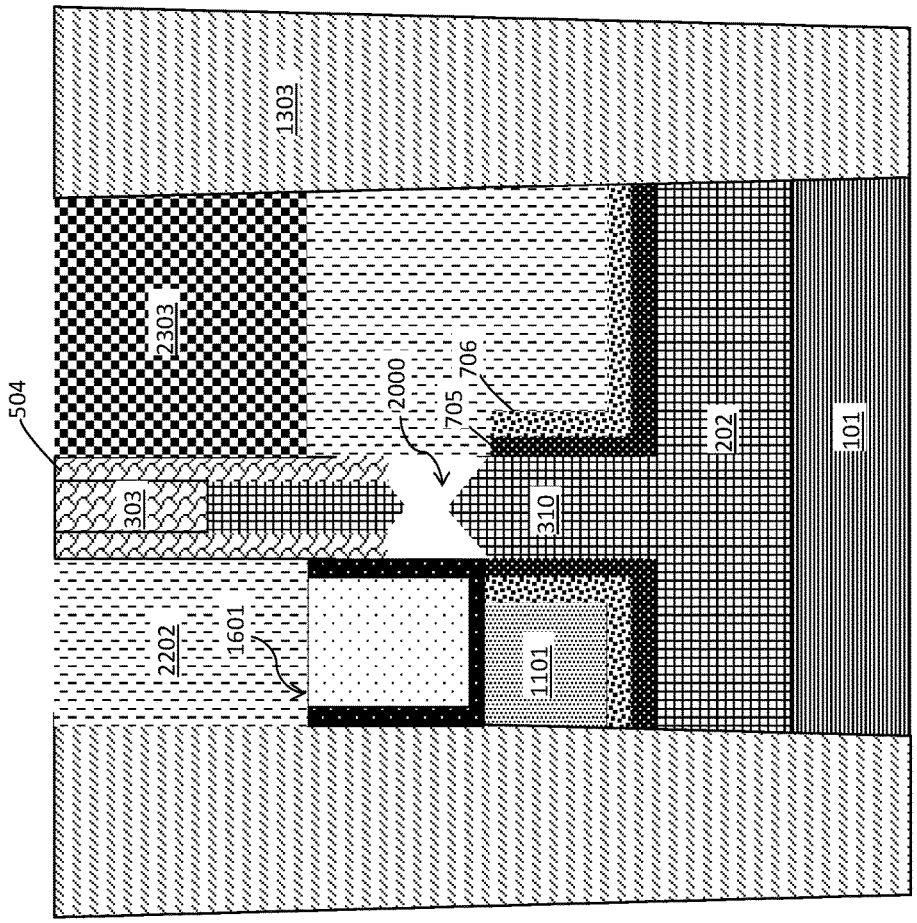

FIG. 23 is a cross-sectional side view after depositing an oxide 2303 and planarizing. The oxide 2303 is deposited directly onto the dielectric 2202 adjacent to the fin 310 and fills the remaining space within the opening between the fin 310 and the isolation region 1303. A planarization process, such as CMP, is performed to remove excess oxide 2303 from surfaces of the isolation regions 1303 and fin 310.

Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 24:
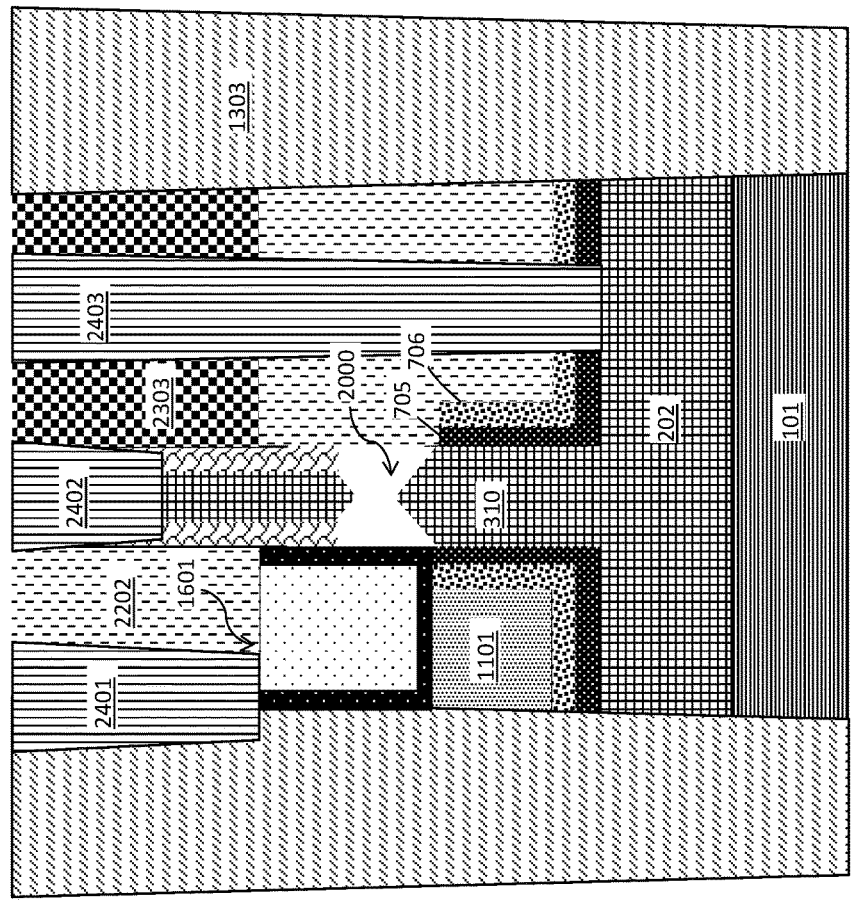

FIG. 24 is a cross-sectional side view after forming contacts. A gate contact 2401, a drain contact 2402, and a source contact 2403 are formed. The gate contact 2401 extends from the surface of the dielectric 2202 to the gate stack 1601. The gate contact 2401 is formed by patterning a trench in the dielectric 2202. To remove the dielectric 2202 and form the gate contact trenches, a resist, such as a photoresist, can be deposited and patterned. An etch process, such as a RIE, can be performed using the patterned resist as an etch mask to remove the dielectric 2202 until the gate stack 1601 is exposed. The gate contact trenches are filled with a conductive material or a combination of conductive materials. The conductive material can be a conductive metal, for example, aluminum (Al), platinum (Pt), gold (Au), tungsten (W), titanium (Ti), or any combination thereof. The conductive material can be deposited by a suitable deposition process, for example, CVD, PECVD, PVD, plating, thermal or e-beam evaporation, or sputtering. A planarization process, for example, CMP, is performed to remove any conductive material from the surface of the dielectric 2202.

The drain contact 2402 extends between the spacers 504 (see FIG. 23) to the doped regions of the fin 310 that form the drain. The hard mask 303 is removed over the drain to form a drain contact trench. To remove the hard mask 303 and form the drain contact trenches, a resist, such as a photoresist, can be deposited and patterned. An etch process, such as a RIE, can be performed using the patterned resist as an etch mask to remove the hard mask 303 until the drain is exposed. The drain contact trenches are filled with a conductive material or a combination of conductive materials. The conductive material can be a conductive metal, for example, aluminum (Al), platinum (Pt), gold (Au), tungsten (W), titanium (Ti), or any combination thereof. The conductive material can be deposited by a suitable deposition process, for example, CVD, PECVD, PVD, plating, thermal or e-beam evaporation, or sputtering. A planarization process, for example, CMP, is performed to remove any conductive material from upper surfaces.

The source contact 2403 extends through the oxide 2303, dielectric 2202, oxide layer 705, and insulating layer 706 to the doped region 202 forming the source. The source contact 2403 is formed within a trench. To form the source trenches, a resist, such as a photoresist, can be deposited and patterned. An etch process, such as a RIE, can be performed using the patterned resist as an etch mask to remove the oxide 2303, dielectric 2202, oxide layer 705, and insulating layer 706 until the doped region 202 is exposed. The source trenches are filled with a conductive material or a combination of conductive materials. The conductive material filling can be a conductive metal, for example, aluminum (Al), platinum (Pt), gold (Au), tungsten (W), titanium (Ti), or any combination thereof. The conductive material can be deposited by a suitable deposition process, for example, CVD, PECVD, PVD, plating, thermal or e-beam evaporation, or sputtering. A planarization process, for example, CMP, is performed to remove any conductive material from upper surfaces.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A vertical transistor, comprising:
a fin arranged on a source over a substrate;
a drain arranged over the source such that the source and drain are arranged vertically with respect to one another;
a vacuum channel comprising an opening within the fin arranged between the source and the drain;

a conductive gate stack arranged on and in contact with a first side fin, the conductive gate stack comprising a gate dielectric, a gate workfunction metal, and a gate metal, the gate dielectric arranged on a first sidewall of the opening of the vacuum channel; and an oxide arranged on an opposing second side of the fin with respect to the conductive gate stack, the oxide arranged on a second sidewall of the opening of the vacuum channel.

2. The vertical transistor of claim 1, wherein the source is a doped source region of the substrate.

3. The vertical transistor of claim 1, wherein the fin, the source, and the drain comprise a dopant.

4. The vertical transistor of claim 1, wherein the fin comprises a bottom portion below the vacuum channel and a top portion above the vacuum channel.

5. The vertical transistor of claim 4, wherein the bottom portion has a diameter that is greater than the top portion.

\* \* \* \* \*